(12) United States Patent
Weeman

(10) Patent No.: US 11,768,248 B2
(45) Date of Patent: Sep. 26, 2023

(54) ESTIMATION OF UNKNOWN ELECTRONIC LOAD

(71) Applicant: Keithley Instruments, LLC, Solon, OH (US)

(72) Inventor: William C. Weeman, Aurora, OH (US)

(73) Assignee: Keithley Instruments, LLC, Solon, OH (US)

( * ) Notice: Subject to any disclaimer, the term of this patent is extended or adjusted under 35 U.S.C. 154(b) by 359 days.

(21) Appl. No.: 16/894,633

(22) Filed: Jun. 5, 2020

(65) Prior Publication Data

US 2020/0400751 A1 Dec. 24, 2020

Related U.S. Application Data

(60) Provisional application No. 62/863,809, filed on Jun. 19, 2019.

(51) Int. Cl.
*G01R 31/3842* (2019.01)
*G01R 31/30* (2006.01)
*G01R 31/319* (2006.01)
*G01R 35/00* (2006.01)

(52) U.S. Cl.
CPC ..... *G01R 31/3842* (2019.01); *G01R 31/3004* (2013.01); *G01R 31/31924* (2013.01); *G01R 35/005* (2013.01)

(58) Field of Classification Search
CPC ............ G01R 31/3842; G01R 31/3004; G01R 31/31924; G01R 35/005
See application file for complete search history.

(56) References Cited

U.S. PATENT DOCUMENTS

| | | | | |
|---|---|---|---|---|
| 5,031,221 | A * | 7/1991 | Yokoyama | H04R 3/002 381/59 |
| 2008/0001608 | A1* | 1/2008 | Saulnier | A61B 5/0536 324/601 |
| 2010/0145640 | A1* | 6/2010 | Aguinaga | G01R 27/2611 702/57 |
| 2017/0257105 | A1* | 9/2017 | Patrizi | H03L 1/00 |

* cited by examiner

*Primary Examiner* — Natalie Huls
*Assistant Examiner* — Sharad Timilsina
(74) *Attorney, Agent, or Firm* — Miller Nash LLP; Andrew J. Harrington

(57) ABSTRACT

A test and measurement instrument including a voltage source configured to output a source voltage, a current sensor, and one or more processors. The one or more processors are configured to determine an estimation of a load of an unknown connected device under test based on the source voltage, the current sensor, and a voltage of the connected device under test without any prior knowledge of the connected device under test.

9 Claims, 4 Drawing Sheets

ESTIMATION OF UNKNOWN ELECTRONIC LOAD

PRIORITY

This disclosure claims benefit of U.S. Provisional Application No. 62/863,809, titled "Estimation of Unknown Electronic Load," filed on Jun. 19, 2019, which is incorporated herein by reference in its entirety.

TECHNICAL FIELD

This disclosure is directed to systems and methods related to test and measurement systems, and in particular, to a source measure unit (SMU) that estimates or identifies a load attached to the SMU.

BACKGROUND

An issue with SMUs is that the circuitry within the SMU to measure current can interfere with and/or delay attempts to force a voltage to a device under test (DUT). Similarly, when trying to force a current to the DUT, the DUT can interfere with and/or delay the attempt to force that current.

Generally, it is difficult to plan for and create an optimum signal response in an SMU because the DUT is supplied by the user of the SMU and therefore may be unknown to the SMU. The DUT can represent one of several different devices, such as resistors, diodes, transistors, capacitors, etc., of varying magnitudes, some of which can have time-varying and level-varying characteristics. In instances of a general purpose SMU, typically almost nothing is known about what device may eventually be connected to the SMU.

Some conventional SMUs will make one or more assumptions about a device, such as specifying a maximum loading capacitance, and various forms of compensation circuitry are then used to create a loop response which will be stable in many instances for loads that are within the assumed parameter(s). The compensation circuitry itself, however, can introduce undesirable behavior in the SMU.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
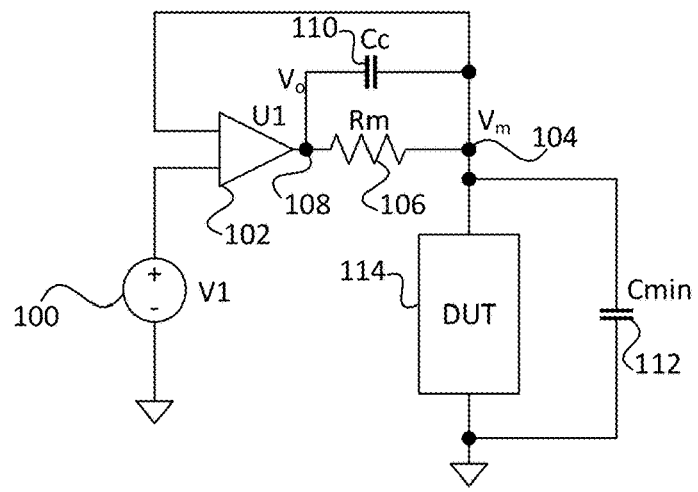
FIG. 1 is an example circuit of a conventional test and measurement instrument with compensation circuitry.

Traditionally, when designing an SMU, assumptions are made about certain parameters of a load, or attached DUT, such as specifying a maximum capacitive or inductive loading. FIG. 1 illustrates an example of a conventional SMU circuitry designed using these assumptions, including compensation circuitry used to create a loop response that will be stable for the majority of different types of attached loads, or DUTs, that are within the assumed parameters.

In some embodiments, FIG. 1 includes a source V1 100 that is input to an operational amplifier U1 102. The operational amplifier U1 102 also receives a voltage 104, labeled as $V_m$, across the DUT 114. A sensing resistor 106, $R_m$, is used to measure the current through the DUT 114. Voltage 108, labeled $V_o$ is output by the operational amplifier 102. The compensation circuitry is represented by capacitors 110 and 112, labeled $C_c$ and $C_{min}$, respectively.

The compensation circuitry, however, can introduce undesirable behavior in the SMU. For example, capacitor 112 can result in a slow settling performance for low-current, low-capacitance connected DUTs. Capacitor 110 can result in limited bandwidth for current measurements, and can also cause current overshoots that require the use of capacitor 112 to compensate. Further, the capacitance values of both capacitors 110 and 112 must be changed to maintain an appropriate ratio as the voltage across the sensing resistor 106 changes compared to the various load voltage ranges that may be applied to the DUT 114. If the capacitance values of capacitors 110 and 112 are not changed, then the performance of the test and measurement instrument will be degraded for certain combinations of voltage and current ranges.

There have been some methods developed to attempt to allow for manual tuning of an SMU to take into account the actual load of the DUT 114. These methods allow, or require, manual tuning of the forward integrator gain-bandwidth and feedback compensating pole-zero pair to tune the output response. This requires a user to spend considerable time characterizing the DUT 114, configuring settings, and then requires either changing configurations for different DUTs or accepting a less-than-optimal configuration for slightly different DUTs.

Other methods to maximize SMU performance include generating test stimuli signals and sending the test stimuli signals to the DUT 114 to measure the response of the DUT 114 and develop a model of the DUT 114. However, these test stimuli signals may damage a DUT 114 if the DUT 114 is not designed to receive such test signals. The chosen test stimuli signals may also not accurately stimulate the DUT 114 over the same range that will ultimately be tested during measurement, which can degrade the accuracy of the model created.

Figure 2:
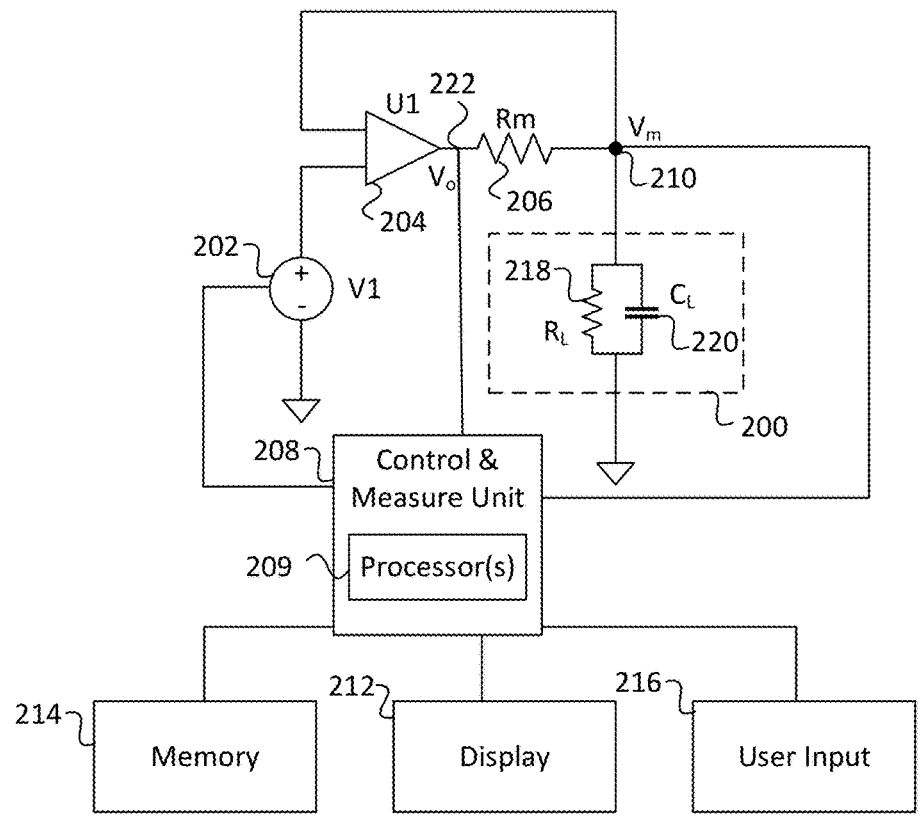
FIG. 2 is an example circuit diagram of a test and measurement instrument for estimating a load according to some embodiments of the disclosure.

Embodiments of the disclosure, as will be discussed in more detail below, employ user-specified test signals and can run in the background as a user test sequence is running to estimate the load of a DUT attached to the test and measurement instrument. That is, embodiments of the disclosure allow for the test and measurement instrument to detect characteristics of a connected DUT and modify the behavior of the test and measurement instrument to drive the connected DUT. FIG. 2 illustrates an example circuit diagram of such a system, according to embodiments of the disclosure.

FIG. 2 illustrates a simplified example of an SMU connected to a DUT 200 according to embodiments of the disclosure. An adjustable voltage source 202 provides the voltage $V_1$ to an input of an operational amplifier 204. The feedback loop provided by a current sensor 206 ($R_m$) forces the other input of the operational amplifier 204 to the value of voltage $V_1$ also FIG. 2 illustrates the current sensor 206 as a sense resistor. However, the current sensor 206 may include any device capable of measuring current, such as, but not limited to, a hall effect sensor, a logarithmic element, etc. Note that the feedback loop is the source of the current through the DUT 200 as well. As a result, the voltage drop across the current sensor 206 is proportional to the current through the DUT 200.

Although not shown, in some embodiments, the operational amplifier 204 is omitted and the voltage $V_1$ from the voltage source is received directly at the current sensor 206.

A control and measure unit 208 can include one or more processors 209 that can instruct the adjustable voltage source 202 to output a desired value $V_1$. The control and measure unit 208 also includes the ability to measure the values of the voltage $V_m$ 210 and the current through the DUT 200, which may include digitizing the measured values. As will be understood by one skilled in the art, the circuit diagram illustrated in FIG. 2 is a simplified circuit diagram and the test and measurement instrument may contain additional components, such as a display 212, a memory 214, and user inputs 216. Memory 214 may also store instructions for execution by the one or more processors in the control and measure unit 208, such as to perform any methods, operations, and/or associated steps indicated by such instructions. For example, memory 214 may include instructions for authoring protocols and debugging protocols, including visually displaying results of the protocol definitions against a known analog signal. As will be understood by one of ordinary skill in the art, memory 214 may include one or more memories, such as, but not limited to, processor cache, random access memory (RAM), read only memory (ROM), solid state memory, hard disk drive(s), or any other memory type.

User inputs 216 are coupled to the control and measure unit 208. User inputs 216 may include a keyboard, mouse, trackball, touchscreen, and/or any other controls employable by a user to interact with a graphical user interface (GUI) on the display 212. The display 212 may be a digital screen, a cathode ray tube based display, or any other monitor to display waveforms, measurements, and other data to a user. Further, additional components, such as one or more analog-to-digital converters may also be present, as would be understood by one skilled in the art.

DUT 200 is represented internally in the control and measure unit 208 as a resistor 218 in parallel with a capacitor 220. However, as will be understood by one of ordinary skill in the art, an actual attached DUT may have many different electrical components. However, the control and measure unit 208 is modeling the DUT 200 as a resistor 218 in parallel with a capacitor 220 to estimate the load of the DUT 200, so such is illustrated in FIG. 2.

An assumption of the DUT 200 represented as a resistor 218 and capacitor 220 in parallel represents a small signal linearization of most typical DUTs encountered Using this simplified model of the SMU and the attached DUT 200, an equation (1) of dynamics can be determined that provides one equation with two unknown components, $R_L$ and $C_L$, where $R_L$ is the resistance of resistor 218 and $C_L$ is the capacitance of capacitor 220

$$\frac{V_o - V_m}{R_m} = C_L * \frac{dV_m}{dt} + \frac{V_m}{R_L} \quad (1)$$

Voltage $V_o$ 222 represents the voltage forced by the operational amplifier 204 onto the current sensor 206. As mentioned above, the voltage $V_m$ 210 represents the voltage at the circuit node between the current sensor 206 and the DUT 200, while the resistance $R_L$ of resistor 218 and the capacitance $C_L$ of capacitor 220 are typically unknown.

Using equation (1), it is possible to determine an error function, as would be understood by one of ordinary skill in the art. This error function then can be used to develop a least-squares estimation that minimizes the deviation of estimates of $R_L$ and $C_L$ from their true values.

Applying the least squares method results in two normal equations which should equal zero when the estimates of $R_L$ and $C_L$ converge to their actual values. The normal equations are:

$$\frac{\partial \varepsilon^2}{\partial C_L} = 0 = 2 * \left(\frac{dV_m}{dt} - \frac{V_o - V_m}{R_m * C_L} + \frac{V_m}{R_L * C_L}\right) * \left(\frac{V_o - V_m}{R_m * C_L^2} - \frac{V_m}{R_L * C_L^2}\right); \quad (2)$$

and $$\frac{\partial \varepsilon^2}{\partial R_L} = 0 = 2 * \left(\frac{dV_m}{dt} - \frac{V_o - V_m}{R_m * C_L} + \frac{V_m}{R_L * C_L}\right) * \left(-\frac{V_m}{R_L^2 * C_L}\right) \quad (3)$$

Theoretically, knowing the values of $R_m$, $V_m$, and V at two discrete and known sample times would allow for the calculation of the unique values of $R_L$ and $C_L$. However, in actual operation, due to the presence of noise and other disturbances that can lead to poor estimations, as well as the desire to avoid time consuming multiple iterations per step or recursion, embodiments of the disclosure gradually step toward the estimated true value in the background, while a user test sequence is running.

A calculation or determination may be run once per sample point, and by continually or repeatedly iterating once on each sample point, an estimate of $R_L$ and $C_L$ can be made, which eventually converges toward the actual values.

Figure 3:
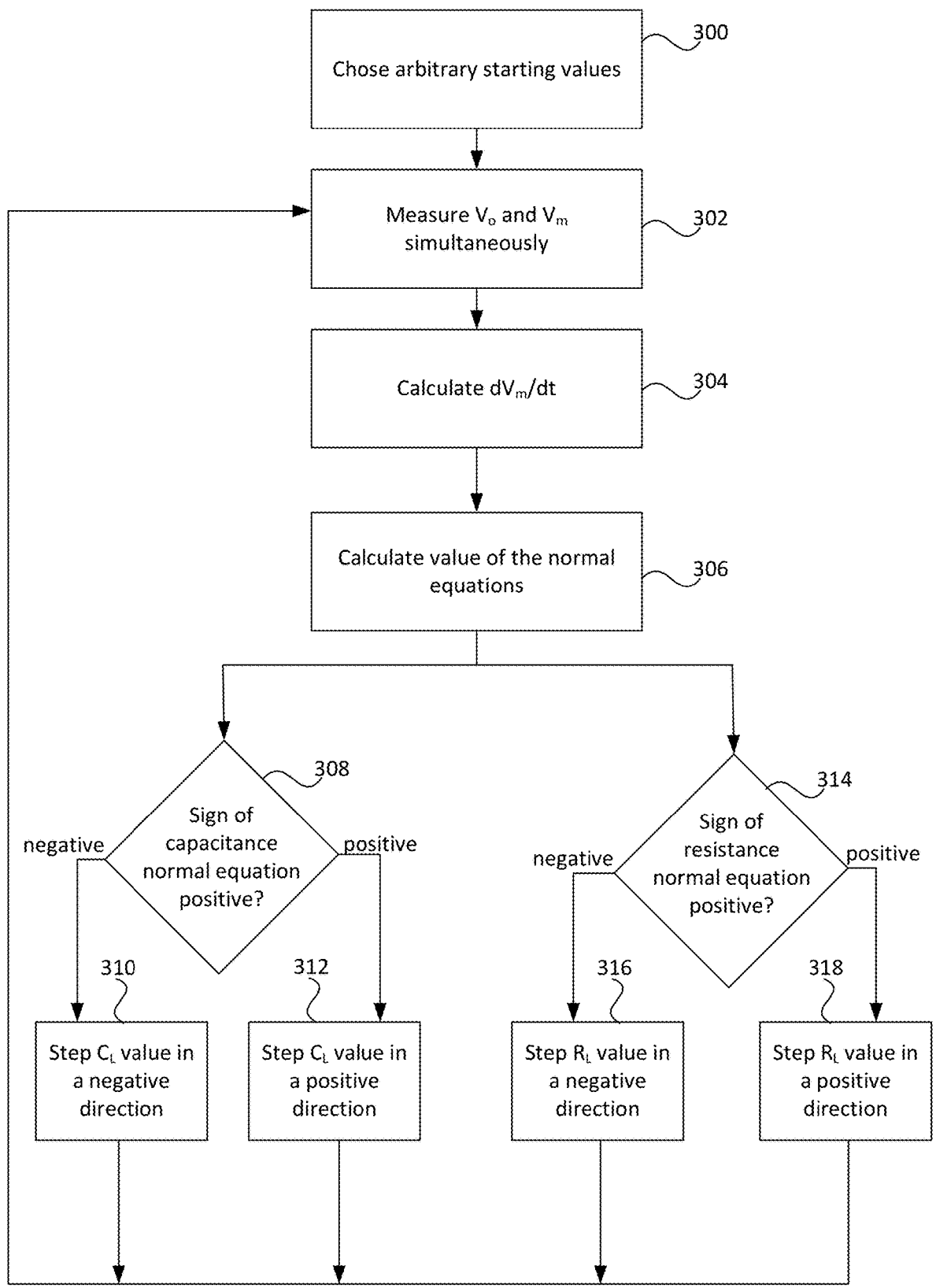
FIG. 3 is a flow chart illustrating example operations for estimating an attached load for a test and measurement instrument according to some embodiments of the disclosure.

FIG. 3 illustrates a flow chart of example operations for estimating a connected DUT 200 or load, without having any prior knowledge of the load of the DUT 200, according to embodiments of the disclosure.

Initially, in operation 300, arbitrary starting values are selected for $R_L$ and $C_L$. Since ideally these values should be close to the expected values, in some embodiments, the initial arbitrary starting values may be selected by a user using the user input 216 of the test and measurement instrument. However, if a user selection is not provided, the control and measure unit 208 can arbitrarily select $R_L$ to be large and $C_L$ to be small, which approximates the condition where the test and measurement output is not connected to any device. The arbitrary values are used only once, and the values of $R_L$ and $C_L$ are updated in each iteration of the illustrated method.

In operation 302, simultaneous values for the voltage $V_o$ 222 and voltage $V_m$ 210 are acquired. In some embodiments, the control and measure unit 208 may know the output of the voltage $V_o$ 222 and it does not need to be measured. Voltage $V_m$ 210 may be measured by using an analog-to-digital converter (not shown) that is intended to measure the voltage across the DUT 200. In operation 302, the values of voltage $V_o$ 222 and voltage $V_m$ 210 preferably should be aligned in time, as sequential sampling leads to incorrect or poor results.

In operation 304, $$\frac{dV_m}{dt}$$

is calculated. This can be done using equation (4), where ΔT is equal to the time between the samples of voltage $V_m$ 210:

$$\frac{dV_m}{dt} = (V_m[n] - V_m[n-1]) * \frac{1}{\Delta T} \quad (4)$$

In operation 306, the values of normal equations (2) and (3) discussed above are determined using the calculated value of $$\frac{dV_m}{dt},$$

the most recent values of $R_L$ and $C_L$, and the known value of the current sensor 206, $R_m$. In some embodiments, the value of $R_m$ is either a nominal value or a calibrated value that depends on the current range and specific test and measurement instrument being used. However, the value is known in each embodiment. In cases where the current sensor 206 is not a resistor, the value of the current measured can be algebraically substituted into the normal equations in place of $$\frac{V_o - V_m}{R_m},$$

which represents the value of the measured current.

The control and measure unit 208 determines the next operation based on whether the results of each of the normal equations (2) and (3) are positive or negative. In operation 308, the control and measure unit 208 determines whether the result of the capacitance equation is positive or negative. In operation 310, if the result of the capacitance equation is negative, then the current value of $C_L$ is stepped in a negative direction. In operation 312, if the result of the capacitance equation is positive, then the current value of $C_L$ is stepped in a positive direction.

For example, if normal equation (2) is equal to +10,000, the value of $C_L$ is stepped in a positive direction, for example, from 101 picofarads (pF) to 102 pF. However, if the normal equation (2) is negative, then the value of $C_L$ is stepped in a negative direction, for example, from 101 pF to 100 pF.

Similarly, in operation 314, the control and measure unit 208 determines whether the result of the resistance equation is positive or negative. In operation 316, if the result of the resistance equation is negative, then the current value of $R_L$ is stepped in a negative direction. In operation 318, if the result of the resistance equation is positive, then the current value of $R_L$ is stepped in a positive direction.

The size of the step to be used is a balance between quick determination of the load of the attached DUT 200 and errors that may appear due to noise or unmodeled disturbances. In some embodiments, the step size may be a function of the current estimated value for the parameters $C_L$ and $R_L$. For example, if the current value of $R_L$ is a large value, larger steps may be used. When $R_L$ becomes smaller, smaller steps may be used. This can allow for quick convergence with similar relative accuracies across a wide dynamic range. In other embodiments, a predetermined step-increment is used no matter the values of the parameters $C_L$ and $R_L$. The predetermined step-increment may be set automatically by the control and measure unit 208 or may be set by a user in the user inputs 216.

Once the values of $C_L$ and $R_L$ are adjusted, the control and measure unit 208 returns to operation 302 and proceeds with the new values of $C_L$ and $R_L$. If there is adequate excitation signal present at the output 222, the estimated values for $C_L$ and $R_L$ should begin to converge towards the actual values of small signal resistance and capacitance represented by the load. If the assumed and/or estimated values for both parameters $C_L$ and $R_L$ are far from the actual values, one value may diverge for a time until the other value approaches the correct value. Continued operation should result in convergence of both estimated values.

In some embodiments, upper and lower bounds may be set for the estimated values of $C_L$ and $R_L$. For example, there may be values for which further changes of $C_L$ and $R_L$ do not result in significant changes to the system dynamics. There may also be bounds where the time constants affected by these values are either so much slower than the system dynamics, or so much faster than the sampling period, that further changes to the values are effectively either "constant" or "instantaneous," respectively. Constraining the estimates of $C_L$ and $R_L$ within a bounded range may help to ensure fast response if the load characteristics change, and also help to prevent any issues related to mathematical properties, such as quantization errors or division by zero.

The upper and lower bounds may be set by a user. For example, if the user is aware that only devices between a particular range of capacitance and/or resistance are being tested, the user may set the upper and lower bounds based on this information. In other embodiments, the control and measure unit 208 may set the bounds based on other factors, such as sample rate, for example.

The absolute or relative magnitude of the input signals $V_o$, $V_m$, and resulting $$\frac{dV_m}{dt},$$

can be tested and used to adjust the step-size of $R_L$ when the signal is relatively stable or settled, and adjust the step-size of $C_L$ when the signal is slewing or moving Practically speaking, once the output signal has fully settled it becomes difficult or impossible to determine what capacitance is located in the DUT. Some level of noise in the system may help to indicate this, but there is a certain threshold of movement required to avoid the estimated capacitance value from moving towards zero once the system has settled. Similarly, there is a certain threshold of output bias voltage required to accurately estimate the value of the DUT resistance. These tests can help to ensure that when there is not an adequate excitation signal to the DUT, the estimated values for the load remain stable and do not begin to diverge.

As mentioned above, embodiments of the disclosure do not require any prior knowledge of the DUT 200 characteristics and can develop an estimate that represents a linear, small-signal model of the attached DUT 200. Further, there is no application of any specific characterization signals required to determine the DUT 200 characteristics. Rather, only the user-specified test signals are used as a stimulus to the attached DUT 200, which may prevent damage to the DUT 200, since the user-specified test signals are ensured to be in a range set by a user that will not damage the DUT 200.

Embodiments of the disclosure may run in the background as a user test sequence is running, or may occur as a calibration prior to performing the test and measurement of the attached DUT 200. This allows for performance to be optimized per attached DUT 200, rather than applying a single "typical" characterization and compensation characteristic across a large number of devices, which may have variations resulting in reduced performance. Once the load characteristics are known by the test and measurement instrument, the load characteristics can be used to improve the performance and the behavior of the test and measurement instrument driving the load.

Embodiments of the disclosure, however, are not limited to DUTs that can be represented by a resistor and capacitor in parallel. In some embodiments, the DUT may be represented by a resistor and capacitor in series. In other embodiments, an inductive DUT may be represented by a resistor and inductor in series or a resistor and inductor in parallel.

Figure 4:
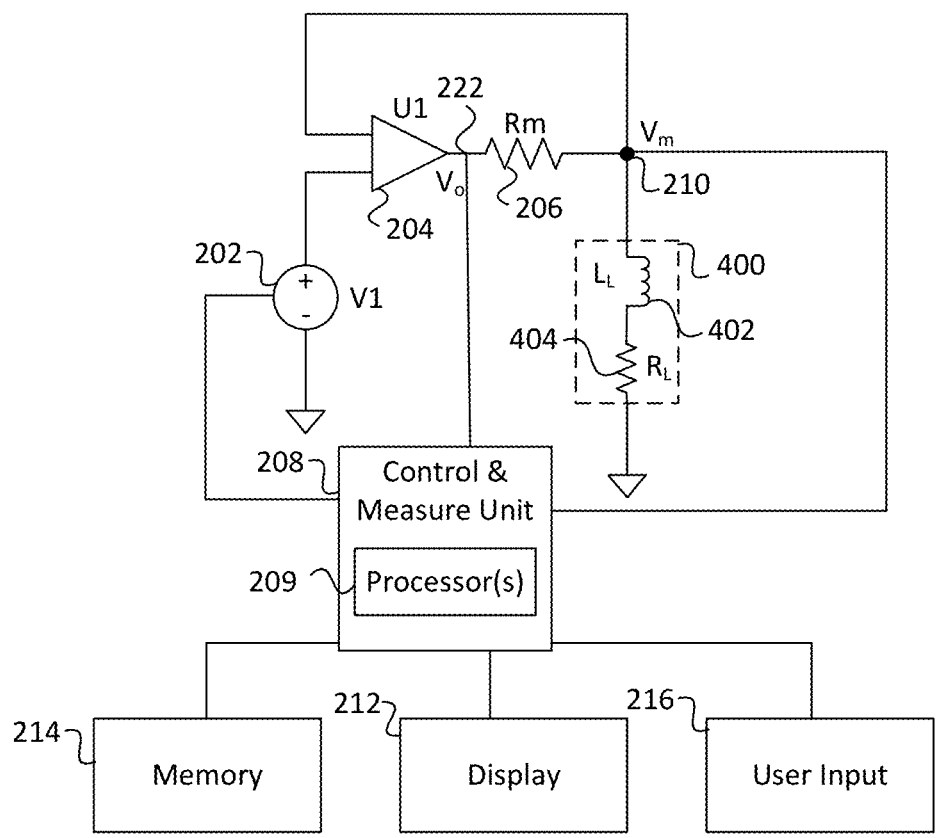
FIG. 4 is another example circuit diagram of a test and measurement instrument for estimating a load according to some embodiments of the disclosure.

FIG. 4 illustrates a circuit modeling the DUT 400 with an inductor 402 in series with a resistor 404. Many of the components of FIG. 4 are the same as those illustrated in FIG. 2 and discussed above. As such, those components are given the same reference numbers and are not discussed in further detail with respect to FIG. 4. Also similar to FIG. 2, the operational amplifier 204 may be removed in some embodiments, and the current sensor 206, although depicted as a sensor resistor in FIG. 4, may be any device that can measure a current.

The current sensed by the current sensor 206 is $I_{RM}$. In FIG. 4, $V_m$ is equal to:

$$V_M = L_L * \frac{dI_{RM}}{dt} + I_{RM} * R_L \quad (5)$$

Using equation 5 and applying the same process as discussed above for equation 1, the normal equations for an inductor and resistor in series DUT are:

$$\frac{\partial \varepsilon^2}{\partial L_L} = 0 = 2 * \left(\frac{dI_{RM}}{dt} - \frac{V_m}{L_L} + \frac{I_{RM} * R_L}{L_L}\right) * \left(\frac{V_m}{L_L^2} - \frac{I_{RM} * R_L}{L_L^2}\right); \quad (6)$$

and $$\frac{\partial \varepsilon^2}{\partial R_L} = 0 = 2 * \left(\frac{dI_{RM}}{dt} - \frac{V_m}{L_L} + \frac{I_{RM} * R_L}{L_L}\right) * \left(-\frac{I_{RM}}{L_L}\right) \quad (7)$$

And equation (8) below can be used in any of equations (5), (6), or (7) for the case of a resistor current sensor 206

$$I_{RM} = \frac{V_o - V_m}{R_m} \quad (8)$$

Similar to embodiments discussed above, whether the normal equations (6) and (7) are positive or negative will vary which direction the inductance and resistance is stepped, as discussed in FIG. 3. That is, whether the load is modeled as a capacitor and resistance in parallel or series, or an inductance and resistance in parallel or series, the control and measure unit 208 can select an arbitrary starting value for the load, and then based on the current sensor 206 and measured voltages, the control and measure unit 208 can step the load toward the actual load value based on whether the normal equations are positive or negative.

Figure 5:
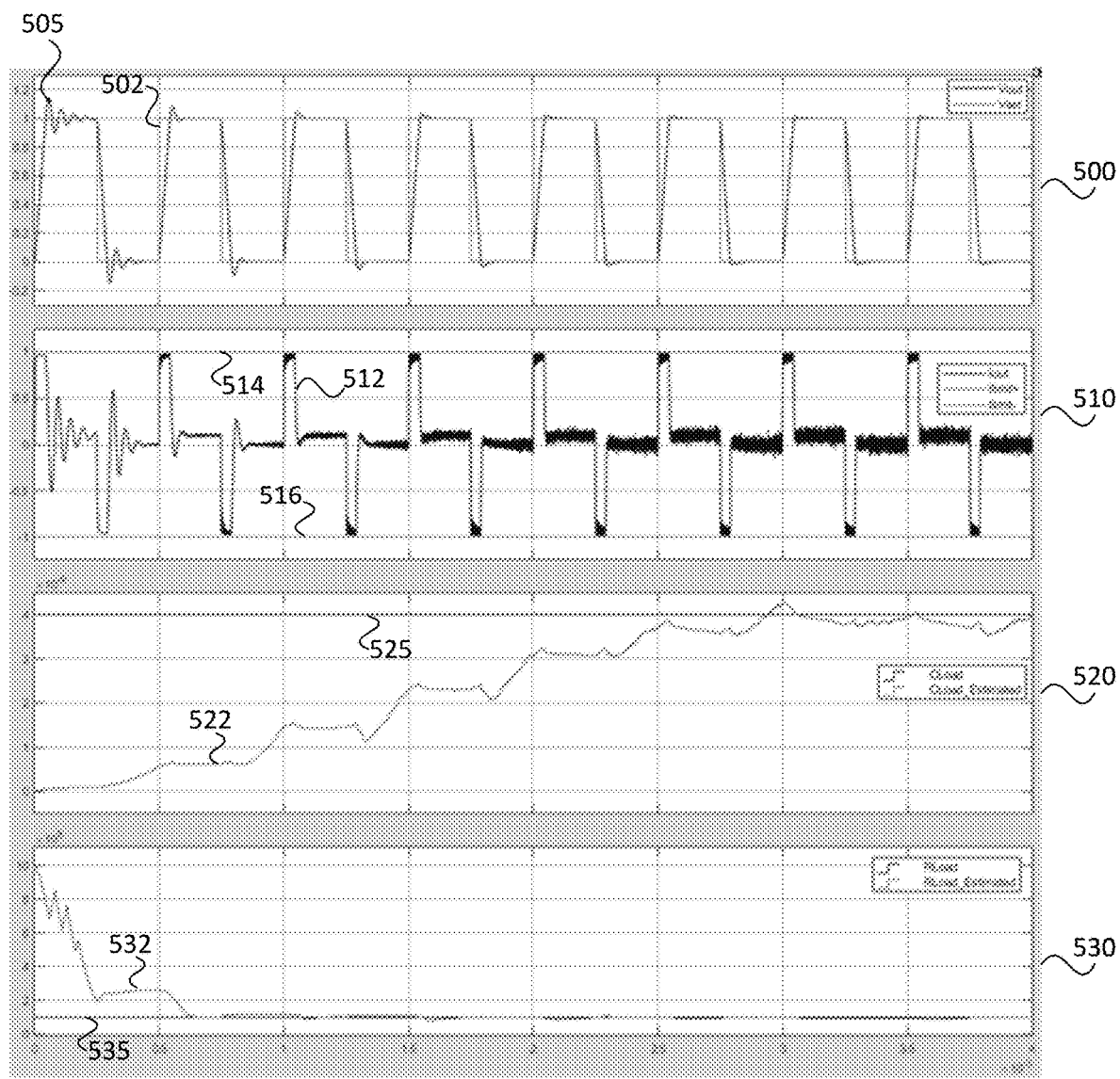
FIG. 5 is a set of graphs to illustrate an example response of an SMU load estimation according to embodiments of the disclosure.

FIG. 5 illustrates an example performance improvement that is possible using embodiments of the disclosure. FIG. 5 illustrates that there is oscillation and/or overshoot in the initial pulse steps on the DUT, which is reduced or eliminated as the estimates for the capacitive and resistive load converge towards their actual values.

Plot 500 illustrates a set output voltage 502 and an actual output voltage 505 of the test and measurement instrument over time. As can be seen, in the initial pulses, there is overshoot and oscillation in the actual output voltage 505, but as the estimated capacitance 522 in plot 520 nears the actual capacitance 525 over time, and the estimated resistance 532 in plot 530 nears the actual resistance 535, the actual output voltage 505 nears the set output voltage 502 with very little overshoot and oscillation.

The same occurs for the current output by the test and measurement instrument, as illustrated in plot 510. Oscillations and overshoot in the actual output current 512 settle out, between the current limits 514 and 516, as the estimated load values converge toward the actual load values over time.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising a voltage source configured to output a source voltage; a current sensor configured to sense a current through a connected device under test, and one or more processors configured to determine an estimation of a load of an unknown connected device under test based on the source voltage, the current, and a voltage of the unknown connected device under test.

Example 2 is the test and measurement instrument of example 1, wherein the one or more processors are further configured to determine the estimation of the load iteratively.

Example 3 is the test and measurement instrument of example 2, wherein the estimation of the load includes an estimation of a resistance and a capacitance or an estimation of a resistance and an inductance.

Example 4 test and measurement instrument of example 3, wherein the one or more processors are further configured to iteratively adjust a value of the resistance based on whether an output of a normal resistance equation is positive or negative and adjust a value of the capacitance or the inductance based on whether an output of a normal capacitance or inductance equation is positive or negative.

Example 5 is the test and measurement instrument of example 4, wherein when the output of the normal resistance equation is positive, the value of the resistance is adjusted upwards, and wherein when the output of the normal capacitance or inductance equation is positive, the value of the capacitance or inductance is adjusted upwards.

Example 6 is the test and measurement instrument of example 5, wherein an amount of the adjustment of the value of the resistance is based on a current estimated value of the resistance, and wherein the amount of the adjustment of the value of the capacitance or inductance is based on a current estimated value of the capacitance or inductance.

Example 7 is the test and measurement instrument of example 5, wherein an amount of the adjustment of the value of the resistance is a predetermined incremental value, and wherein the amount of the adjustment of the value of the capacitance or inductance is a predetermined incremental value.

Example 8 is the test and measurement instrument of any one of examples 2-7, wherein the one or more processors are further configured to determine the estimation of the load iteratively by selecting arbitrary starting values for the load; determining simultaneously the source voltage and the voltage of the connected device under test, determining based on the source voltage, the voltage of the connected device under test, and the arbitrary starting values for the load whether to adjust an estimated value of a resistance of the load in a positive or negative direction and whether to adjust an estimated value of a capacitance or inductance of the load in a positive or negative direction; and adjusting the arbitrary starting values for the resistance and the capacitance or inductance either positively or negatively such that the adjusted values represent the estimation of the load.

Example 9 is the test and measurement instrument of example 8, wherein the one or more processors are further configured to determine the estimation of the load iteratively by determining simultaneously another output voltage from the voltage source and the voltage of the attached device under test, determining based on the output voltage, the voltage of the attached device under test, and the adjusted values for the load whether to adjust the estimated value of the resistance in a positive or negative direction and whether to adjust the value of the estimated capacitance or inductance in a positive or negative direction; and adjusting the estimated values for the resistance and the capacitance or inductance either positively or negatively such that the adjusted estimated values represent a refined estimation of the load.

Example 10 is the test and measurement instrument of example 8, wherein the one or more processors are further configured to limit the adjusted value of the resistance based on an upper bound and a lower bound and to limit the adjusted value of the capacitance or inductance based on an upper bound and a lower bound.

Example 11 is the test and measurement instrument of example 10, wherein the upper and the lower bounds of the values of the resistance and the capacitance or inductance are set by a user.

Example 12 is the test and measurement instrument of any one of examples 7-11, wherein the arbitrary starting value is selected to approximate a condition where the device under test is not attached.

Example 13 is a method for estimating an unknown load coupled to a test and measurement instrument, comprising acquiring a voltage at a circuit node between a current sensor and a device under test, wherein the device under test presents the unknown load to the test and measurement instrument, determining an output voltage forced on the current sensor; determining a current through the device under test using the current sensor, and determining an estimated value of the load based on the voltage at the circuit node, the current, and the output voltage.

Example 14 is the method of example 13, further comprising iteratively determining a new estimated value of the load, the load including either a resistance and a capacitance or a resistance and an inductance.

Example 15 is the method of example 14, wherein determining the new estimated value of the resistance and the capacitance or inductance of the attached device under test includes selecting arbitrary starting values for the resistance and the capacitance or inductance, determining simultaneously the output voltage and the voltage at the circuit node; determining based on the output voltage, the voltage at the circuit node, and the arbitrary starting values for the resistance and capacitance or inductance whether to adjust the value of the resistance in a positive or negative direction and whether to adjust the value of the capacitance or inductance in a positive or negative direction; and creating a new estimated value for the resistance and the capacitance or inductance by adjusting the arbitrary starting value either positively or negatively.

Example 16 is the method of example 15, wherein determining the estimation of the resistance and the capacitance of the attached device under test further includes determining simultaneously another output voltage and the voltage at the circuit node; determining based on the output voltage, the voltage at the circuit node, and the new estimated values for the resistance and the capacitance or the inductance whether to adjust the value of the resistance in a positive or negative direction and whether to adjust the value of the capacitance or inductance in a positive or negative direction; and adjusting the new estimated value for the resistance and the capacitance or inductance either positively or negatively.

Example 17 is the method of any one of examples 14-16, wherein the new estimated value of the resistance is limited based on an upper bound and a lower bound and the new estimated value of the capacitance or inductance is limited based on an upper bound and a lower bound.

Example 18 is the method of example 17, wherein the upper and the lower bounds of the values of the resistance and the capacitance or inductance are set by a user.

Example 19 is the method of any one of examples 14-18, wherein the arbitrary starting value is selected to approximate a condition when the device under test is not attached.

Example 20 is the method of any one of examples 14-19, wherein determining an estimation of a resistance and a capacitance or inductance includes adjusting a value of the estimated resistance based on whether an output of a normal resistance equation is positive or negative and adjusting a value of the estimated capacitance or inductance based on whether an output of a normal capacitance or inductance equation is positive or negative.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument, comprising:
a voltage source configured to output a source voltage;
a current sensor configured to sense a current through a connected device under test; and
one or more processors configured to
iteratively determine an estimation of a load of an unknown connected device under test, the estimation of the load including an estimation of a resistance and a capacitance or an estimation of a resistance and an inductance, the estimation based on the source voltage, the current, and a voltage of the unknown connected device under test, wherein the estimation of the load is adjusted upwards or downwards at each iteration, and to
iteratively adjust a value of the resistance based on whether an output of a normal resistance equation is positive or negative and adjust a value of the capacitance or the inductance based on whether an output of a normal capacitance or inductance equation is positive or negative.

2. The test and measurement instrument of claim 1, wherein when the output of the normal resistance equation is positive, the value of the resistance is adjusted upwards, and wherein when the output of the normal capacitance or inductance equation is positive, the value of the capacitance or inductance is adjusted upwards.

3. The test and measurement instrument of claim 2, wherein an amount of the adjustment of the value of the resistance is based on a current estimated value of the resistance, and wherein the amount of the adjustment of the value of the capacitance or inductance is based on a current estimated value of the capacitance or inductance.

4. The test and measurement instrument of claim 2, wherein an amount of the adjustment of the value of the resistance is a predetermined incremental value, and wherein the amount of the adjustment of the value of the capacitance or inductance is a predetermined incremental value.

5. A test and measurement instrument, comprising:
a voltage source configured to output a source voltage;
a current sensor configured to sense a current through a connected device under test; and
one or more processors configured to iteratively determine an estimation of a load of an unknown connected device under test based on the source voltage, the current, and a voltage of the unknown connected device under test, wherein the estimation of the load is adjusted upwards or downwards at each iteration, in which iteratively determining the estimation of the load includes:
selecting arbitrary starting values for the load;
determining simultaneously the source voltage and the voltage of the connected device under test;
determining based on the source voltage, the voltage of the connected device under test, and the arbitrary starting values for the load whether to adjust an estimated value of a resistance of the load in a positive or negative direction and whether to adjust an estimated value of a capacitance or inductance of the load in a positive or negative direction; and
adjusting the arbitrary starting values for the resistance and the capacitance or inductance either positively or negatively such that the adjusted values represent the estimation of the load.

6. The test and measurement instrument of claim 5, wherein the one or more processors are further configured to determine the estimation of the load iteratively by:
determining simultaneously another output voltage from the voltage source and the voltage of the attached device under test;
determining based on the output voltage, the voltage of the attached device under test, and the adjusted values for the load whether to adjust the estimated value of the resistance in a positive or negative direction and whether to adjust the value of the estimated capacitance or inductance in a positive or negative direction; and
adjusting the estimated values for the resistance and the capacitance or inductance either positively or negatively such that the adjusted estimated values represent a refined estimation of the load.

7. The test and measurement instrument of claim 5, wherein the one or more processors are further configured to limit the adjusted value of the resistance based on an upper bound and a lower bound and to limit the adjusted value of the capacitance or inductance based on an upper bound and a lower bound.

8. The test and measurement instrument of claim 7, wherein the upper and the lower bounds of the values of the resistance and the capacitance or inductance are set by a user.

9. The test and measurement instrument of claim 5, wherein the arbitrary starting value is selected to approximate a condition where the device under test is not attached.

* * * * *